(12) United States Patent
Meyer et al.

(10) Patent No.: US 9,331,057 B2
(45) Date of Patent: May 3, 2016

(54) SEMICONDUCTOR DEVICE

(75) Inventors: Thorsten Meyer, Regensburg (DE); Grit Sommer, Grafing (DE); Ralf Plieninger, Poing (DE)

(73) Assignee: Infineon Technologies AG, Neubiberg (DE)

( * ) Notice: Subject to any disclaimer, the term of this patent is extended or adjusted under 35 U.S.C. 154(b) by 805 days.

(21) Appl. No.: 11/924,691

(22) Filed: Oct. 26, 2007

(65) Prior Publication Data

US 2009/0108401 A1    Apr. 30, 2009

(51) Int. Cl.

| | |
|---|---|
| *H01L 21/20* | (2006.01) |
| *H01L 25/16* | (2006.01) |
| *H01L 23/522* | (2006.01) |
| *H01L 23/64* | (2006.01) |
| *H01L 23/00* | (2006.01) |

(Continued)

(52) U.S. Cl.
CPC ............ *H01L 25/16* (2013.01); *H01L 23/5223* (2013.01); *H01L 23/642* (2013.01); *H01L 24/19* (2013.01); *H01L 24/96* (2013.01); *H01L 24/97* (2013.01); *H01L 25/50* (2013.01); *H01L 21/568* (2013.01); *H01L 28/40* (2013.01); *H01L 2224/0401* (2013.01); *H01L 2224/04105* (2013.01); *H01L 2224/05548* (2013.01); *H01L 2224/12105* (2013.01); *H01L 2224/13022* (2013.01); *H01L 2224/20* (2013.01); *H01L 2224/24195* (2013.01); *H01L 2224/92* (2013.01); *H01L 2224/97* (2013.01); *H01L 2924/01005* (2013.01); *H01L 2924/01013* (2013.01); *H01L 2924/01019* (2013.01); *H01L 2924/01029* (2013.01); *H01L 2924/01033* (2013.01); *H01L 2924/01068* (2013.01); *H01L 2924/01078* (2013.01); *H01L 2924/01082* (2013.01); *H01L 2924/14* (2013.01); *H01L 2924/15311* (2013.01); *H01L 2924/19041* (2013.01); *H01L 2924/30105* (2013.01)

(58) Field of Classification Search
CPC . H01L 23/5223; H01L 2924/30; H01L 21/20; H01L 21/302; H01L 23/02
USPC .................. 257/277, 310, 534, 552, E21.008, 257/E51.003, 532, 782, 678; 361/301.4; 438/393

See application file for complete search history.

(56) References Cited

U.S. PATENT DOCUMENTS 4,974,039 A * 11/1990 Schindler et al. ............. 257/277
5,377,072 A    12/1994 Sparkman et al.

(Continued)

FOREIGN PATENT DOCUMENTS

| DE | 102008046864 | 4/2009 |
|---|---|---|
| JP | 2003133476 | 9/2003 |

OTHER PUBLICATIONS

"Embedded Wafer Level Ball Grid Array (eWLB)", M. Brunnbauer, et al., 2006 Electronics Packaging Technology Conference, 2006 IEEE.

*Primary Examiner* — Kenneth Parker
*Assistant Examiner* — Fang-Xing Jiang
(74) *Attorney, Agent, or Firm* — Dicke, Billig & Czaja, PLLC

(57) ABSTRACT

A semiconductor device is disclosed. One embodiment provides a semiconductor chip. The semiconductor chip includes a first electrode of a capacitor. An insulating layer is arranged on top of the first electrode. A second electrode of the capacitor is applied over the insulating layer, wherein the second electrode is made of a conductive layer arranged over the semiconductor chip.

18 Claims, 7 Drawing Sheets

(51) Int. Cl.
   *H01L 25/00* (2006.01)
   *H01L 49/02* (2006.01)
   *H01L 21/56* (2006.01)

(56) References Cited

U.S. PATENT DOCUMENTS

| | | | |
|---|---|---|---|
| 5,563,762 A * | 10/1996 | Leung et al. | 361/301.4 |
| 5,736,448 A * | 4/1998 | Saia et al. | 438/393 |
| 5,953,635 A * | 9/1999 | Andideh | H01L 21/31053 257/E21.244 |
| 6,100,574 A * | 8/2000 | Norstrom et al. | 257/532 |
| 6,184,551 B1 * | 2/2001 | Lee et al. | 257/310 |
| 6,239,482 B1 * | 5/2001 | Fillion et al. | 257/678 |
| 6,624,501 B2 * | 9/2003 | Shioga et al. | 257/534 |
| 7,059,041 B2 | 6/2006 | Behammer | |
| 2005/0082639 A1 * | 4/2005 | Kikuta | H01L 27/0629 257/533 |
| 2005/0151249 A1 | 7/2005 | Eckstein et al. | |
| 2005/0269946 A1 | 12/2005 | Jeong et al. | |
| 2006/0267885 A1 | 11/2006 | Kwak et al. | |
| 2006/0284323 A1 * | 12/2006 | Hashimoto | 257/782 |
| 2007/0159078 A1 | 7/2007 | Park et al. | |

\* cited by examiner

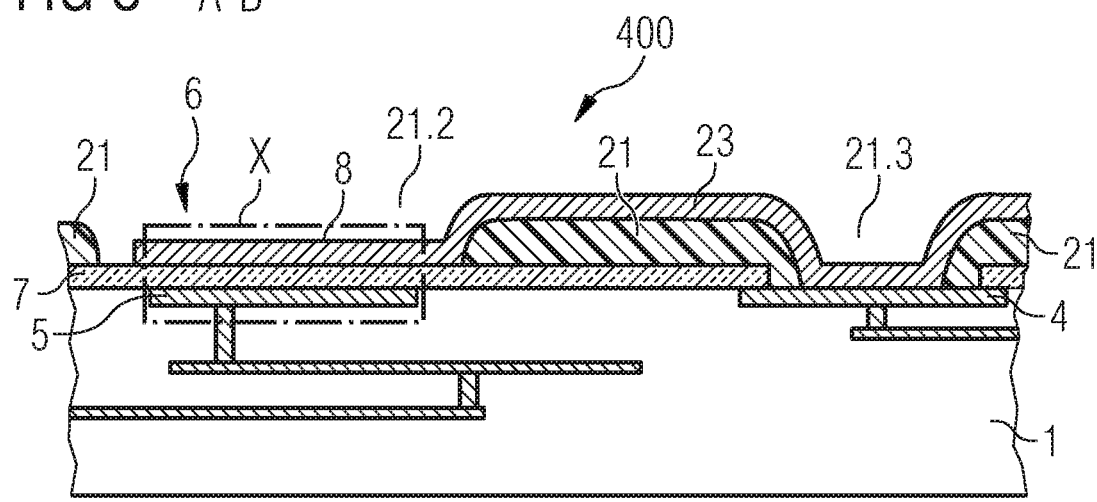
FIG 8 A-B
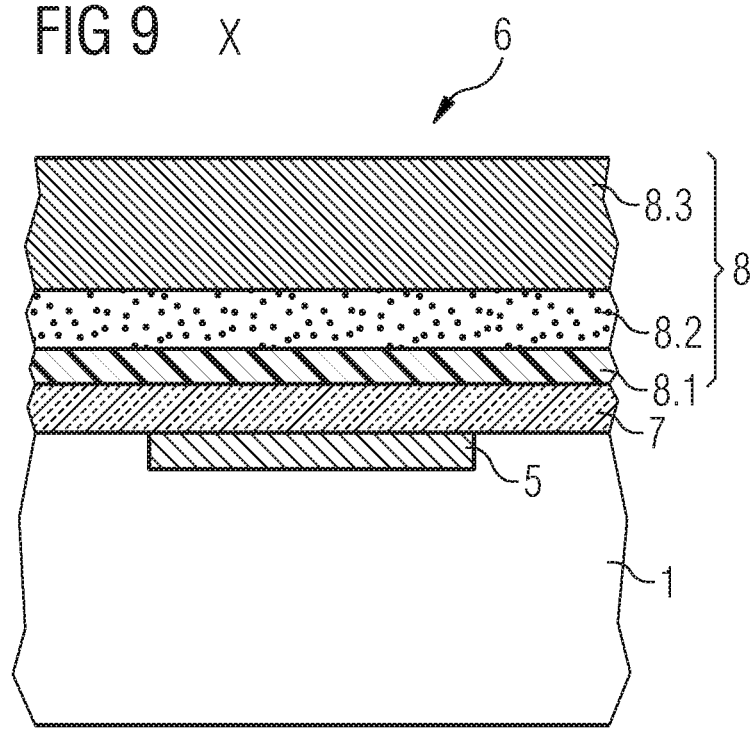
FIG 9 X

SEMICONDUCTOR DEVICE

BACKGROUND

The invention relates to semiconductor devices and more particularly to the technique of generating a capacitor in a semiconductor device.

Semiconductor devices include one or more semiconductor chips which may have internal semiconductor structures and possibly internal mechanical structures. Typically, the semiconductor chips of such devices have chip pads which are connected to external semiconductor device contacts by a conductive redistribution layer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 8 illustrates a schematic cross-sectional view of the semiconductor device illustrated in FIG. 7 along line A-B;

FIG. 9 illustrates a schematic cross-sectional view of a detail X illustrated in FIG. 8;

DETAILED DESCRIPTION

Figure 1:
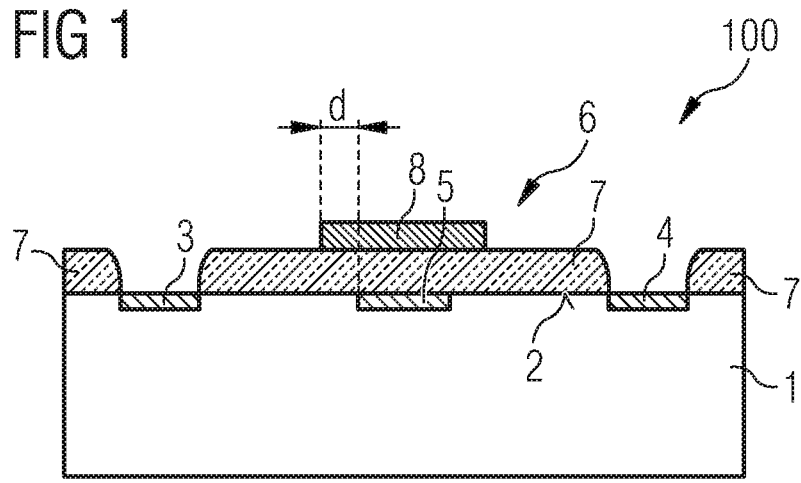
FIG. 1 illustrates a schematic cross-sectional view of a semiconductor device according to a first exemplary embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In the following, embodiments of the invention are described with reference to the drawings, wherein like reference numerals are generally utilized to refer to like elements throughout the description, and wherein the various structures are not necessarily drawn to scale. In the following description, for purposes of explanation, numerous specific details are set forth in order to provide a thorough understanding of one or more aspects of embodiments of the invention. It may be evident, however, to one skilled in the art that one or more aspects of the embodiments of the invention may be practiced with a lesser degree of these specific details. In other instances, known structures and devices are illustrated in a simplified representation in order to facilitate describing one or more aspects of the embodiments of the invention. The following description is therefore not to be taken in a limiting sense, and the scope of the invention is defined by the appended claims.

Semiconductor devices having an embedded capacitor are described below. The semiconductor devices include a semiconductor chip which may be of extremely different types, may be manufactured by different technologies and may include, for example, integrated electrical circuits, electro-optical circuits, micromechanical structures such as bridges, membranes or tongue structures, and passives. This integrated circuit, if provided within the chip, may include a first electrode of a capacitor. The first electrode may e.g., be made of the metal which is used for generating the internal wiring of the semiconductor chip, such as copper or aluminum. Further, the semiconductor device includes a second electrode which is separated from the first electrode by an insulating layer. This second electrode of the capacitor is arranged over the semiconductor chip, i.e. does not form a part of the internal chip wiring or metallization of the semiconductor chip. The second electrode may be made of any appropriate material, e.g., a metal, a conductive polymer, etc.

According to one embodiment, the insulating layer separating the first electrode and the second electrode is made of an inorganic material. In the art of semiconductor processing, typically an insulating layer of inorganic material (so-called passivation layer) is applied on the semiconductor chip surface. This passivation layer may be used as the insulating layer which separates the first and second electrodes of the capacitor.

The insulating layer may be made of any appropriate material such as e.g., silicon oxide, silicon nitride, oxinitride, low-k dielectric material (i.e. a dielectric material with a smaller dielectric constant than silicon dioxide) and ferroelectric material. Further, mixtures of such materials are possible.

The thinner the insulating layer between the first and second electrodes, the higher is the capacitance of the capacitor. The thickness of the insulating layer on top of the first electrode may be less than 300 nm, in particular less than 200 nm. Typically, hard passivation layers used in the semiconductor processing have a thickness of 100 nm or more. Therefore, it is possible to use such hard passivation layer without any further processing as the insulating layer used in the capacitor. However, it is also possible that the insulating layer on top of the first electrode has a thickness of less than 50 nm, in particular less than 30 nm. To this end, it is possible to use a thinner portion of the passivation layer as the insulating layer within the capacitor. Further, it is to be noted that the insulating layer may be made of an inorganic material (such as the inorganic materials mentioned above) which is different to the inorganic material used for the passivation layer. To this end, the passivation layer may be opened over the first electrode and replaced by the insulating layer. Still further, it is also feasible that the insulating layer is made of a polymer layer arranged over the first electrode of the semiconductor chip.

Conventional semiconductor devices use capacitors which are either completely integrated within the semiconductor chip (both electrodes thereof are formed by metal layers of the semiconductor chip) or are completely established in a redistribution layer structure including polymer layers and metal layers which are used to route electrical signals between external contact pads of the semiconductor device and chip pads of the semiconductor chip. Capacitors completely embedded in the redistribution layer structure have capacitances per area of typically about 3 to 5 pF/mm$^2$. Further, high tolerances of typically 3 to 5% or more may occur. On the other hand, capacitors according to embodiments described below may have a significantly higher capacitance per area of about 100 to 550 pF/mm$^2$ or even more. Further, tolerances are significantly lower because the first electrode, which is generated during frontend wafer processing, may be implemented with much higher accuracy than any electrode which is generated in the redistribution layer system during the backend processing.

In all embodiments, the chip pads of the semiconductor chip may be made of the same metal layer as the first electrode of the capacitor. This metal layer may be the uppermost metal layer of the semiconductor chip applied during frontend processing.

On the other hand, the second electrode may be made of the same metal layer as a conductive line which connects contact pads representing external terminals of the semiconductor device to the chip pads of the semiconductor chip. Thus, the second electrode is typically fabricated in course of the generation of the redistribution layer system during backend processing. Therefore, the high positional accuracy available by the frontend processing technology is combined with the cost efficiency available in the backend processes.

Embodiments of the semiconductor device may be implemented virtually in all types of modules. By way of example, embodiments of the semiconductor device as described further below may be implemented in "fan-out" type modules, in which the semiconductor chip is embedded in a mold material laterally surrounding the semiconductor chip. Further, multi-chip modules (e.g., of the fan-out type) may be provided in which a plurality of chips are embedded in a mold material laterally surrounding the semiconductor chips. In such multi-chip modules, only some of the semiconductor chips may include a first electrode of a capacitor in accordance with the invention. More specifically, a first semiconductor chip may include an integrated circuit (and optionally no first electrode of a capacitor in accordance with the invention) and a second semiconductor chip may include such first electrode of a capacitor and a chip pad connected to the first electrode, however optionally no integrated circuit (i.e. transistors etc.).

FIG. 1 illustrates a semiconductor device 100 according to a first exemplary embodiment. The semiconductor device 100 includes a semiconductor chip 1 having a first main surface 2. Chip pads 3, 4 are exposed at the first main surface 2 of the semiconductor chip 1. Further, a first electrode 5 of a capacitor 6 is provided at the first main surface 2 of the semiconductor chip 1. The chip pads 3, 4 and the first electrode 5 may be structured from the same metal layer. This metal layer may be the uppermost metal layer applied during frontend wafer level processing. Similar to the chip pads 3, 4, the first electrode 5 forms a part of the first main surface 2 of the semiconductor chip 1. As known in the art, during frontend wafer processing, integrated circuits (having functional elements such as e.g., transistors, diodes, chip-internal capacitors etc. and an internal chip wiring) are formed in the semiconductor chips, whereby the chip pads 3, 4 are interconnected to the functional elements of the integrated circuit by the internal chip wiring.

The first main surface 2 of the semiconductor chip 1 is covered by an insulating layer 7. This insulating layer 7 may also be applied during the frontend processing of a wafer in which a plurality of semiconductor chips 1 are fabricated. The insulating layer 7 may be a hard passivation layer made of an inorganic material such as silicon oxide, silicon nitride, oxinitride etc. Typically, such insulating layer 7 covers substantially the entire first main surface 2 of the semiconductor chip 1, i.e. is only removed above the chip pads 3, 4 in order to allow electrical contact thereto.

A second electrode 8 of the capacitor 6 is applied on the insulating layer 7 and may be in direct contact thereto. Thus, the thickness of the insulating layer 7 may define the distance between the first electrode 5 and the second electrode 8 of the capacitor 6. The second electrode 8 may be made of any conductive material as mentioned before. It is to be noted that this second electrode 8 does not belong to the semiconductor chip metallization, i.e. does not form part of any metal layer applied during frontend wafer processing. Typically, the second electrode 8 is applied during backend processing and forms a part of a conductive redistribution structure. This will be explained further below.

The area of the second electrode 8 may be larger than the area of the first electrode 5 at least in one lateral dimension. For instance, the excess length d between an edge-to-edge projection of the first and second electrodes 5, 8 may be larger than 0.2 µm, more particular larger than 0.4 µm. As typical positional tolerances during backend processing are of about 4 µm, the oversize of the second electrode 8 in relation to the first electrode 5 guarantees that manufacturing tolerances during backend processing will not result in a serious positional mismatch of the first and second electrodes 5, 8. Such mismatch would significantly decrease the capacitance of the capacitor 6.

Figure 2:
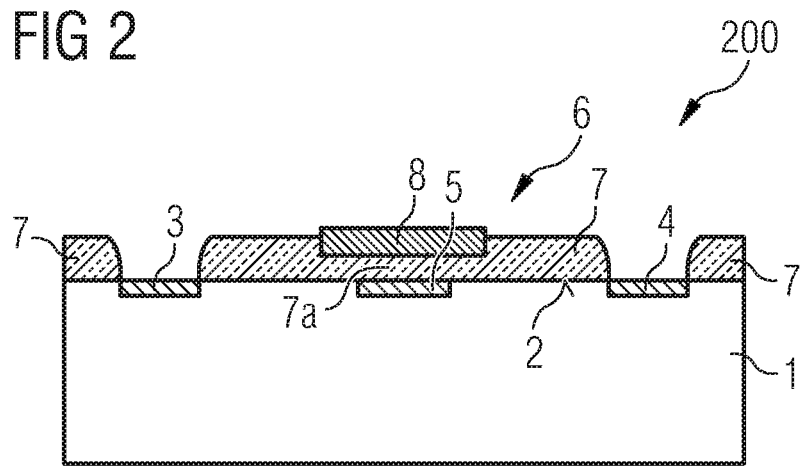
FIG. 2 illustrates a schematic cross-sectional view of a semiconductor device according to a second exemplary embodiment.

FIG. 2 illustrates a second exemplary embodiment of a semiconductor device 200. Like parts as in FIG. 1 are referred to by the same reference signs. The description in conjunction with FIG. 1 largely applies also to FIG. 2 and is to this extent omitted in order to avoid reiteration. The semiconductor device 200 is similar to the semiconductor device 100 except that the insulating layer 7 is thinner in a region 7a between the first and second electrodes 5, 8 than in a region outside the first and second electrodes 5, 8. The thickness of the insulating layer 7 at region 7a may be as small as about 20 nm or 50 nm. That way, the capacitance of the capacitor 6 may significantly increase compared to the capacitance of the capacitor 6 as illustrated in FIG. 1 (provided that the lateral dimensions of the first and second electrodes 5, 8 are identical).

Similar to FIG. 1, the insulating layer 7, 7a may be fabricated from a conventional passivation layer of uniform thickness (which is typically more than 100 nm) except that at the region 7a of the insulating layer 7, additional processing is necessary to provide for the reduced thickness. The region 7a of reduced thickness may, for instance, be generated by an etching process which reduces the thickness of the insulating layer 7 over the first electrode 5 to the thickness of the insulating layer 7 at region 7a. Another possibility is to open the insulating 7 above the first electrode 5 concurrently with opening the insulating layer 7 over the chip pads 3, 4 and then to selectively apply a thin insulating layer 7a over the first electrode 5. In this case, the insulating layer 7a over the first electrode 5 may be made of another material than the insulating layer 7 forming the passivation layer of the semiconductor chip 1. For instance, in this case, the insulating layer within the capacitor 6 may be made of a low-k material or a ferroelectric material, whereas the insulating layer 7 outside of the capacitor 6 may be a usual passivation layer made of e.g., silicon oxide, silicon nitride, oxinitride etc.

Further, it is to be noted that the insulating layer 7 may be made of an organic polymer material which may be applied during backend processing. Such dielectric polymer layer may be a layer made of a photoresist or of any other etching resist, and may be deposited e.g., by chemical vapor deposition (CVD), physical vapor deposition (PVD) or spin coating. In this case, it may not be necessary to apply an inorganic passivation layer.

Figure 3:
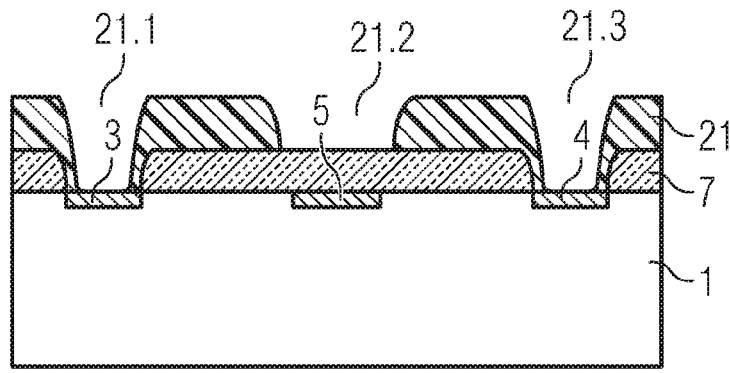
FIG. 3 illustrates a schematic cross-sectional view of the semiconductor device illustrated in FIG. 1 in a method of manufacturing the semiconductor module illustrated in FIG. 5.
Figure 4:
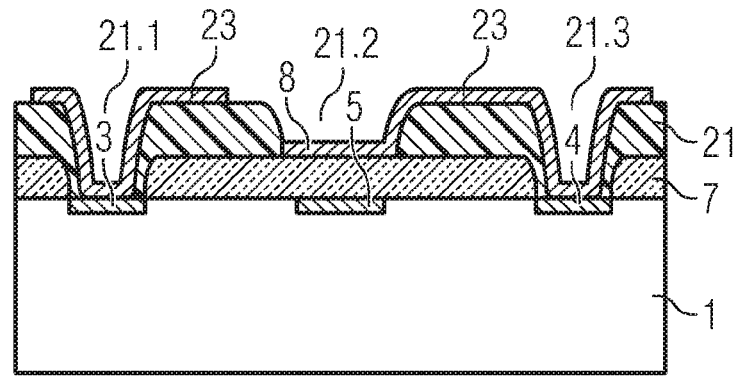
FIG. 4 illustrates a schematic cross-sectional view of the semiconductor device illustrated in FIG. 3 in a method of manufacturing the semiconductor module illustrated in FIG. 5.
Figure 5:
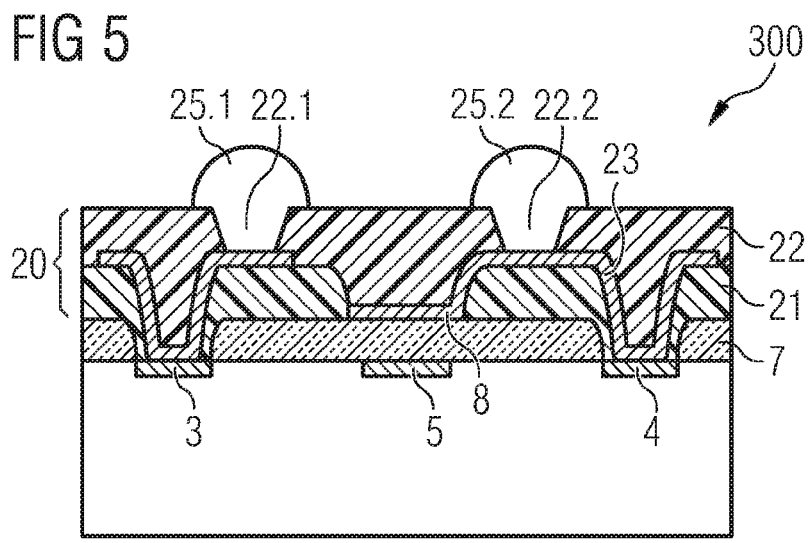
FIG. 5 illustrates a schematic cross-sectional view of a semiconductor module manufactured on the basis of the semiconductor device illustrated in FIG. 1.

FIGS. 3 to 5 illustrate manufacturing processes for fabricating a semiconductor module 300 embodying the semiconductor device 100. Analogously, a semiconductor module according to semiconductor module 300 could be fabricated embodying the semiconductor device 200.

FIG. 5 illustrates a conductive redistribution structure 20 including of a first polymer layer 21, a second polymer layer 22 and a metal layer 23 arranged between the first polymer layer 21 and the second polymer layer 22. The second polymer layer 22 includes openings 22.1, 22.2 through which a contact is made between external contact elements 25.1, 25.2 (e.g., solder balls) and the metal layer 23. The metal layer 23 is often referred to as redistribution layer in the art.

The fabrication process of semiconductor module 300 is exemplified by FIGS. 3 and 4. The first polymer layer 21 is deposited on the semiconductor device 100. The thickness of the first polymer layer 21 may be between 2 and 10 µm, typically about 5 µm. A standard CVD process or spin coating process may be used. The first polymer layer 21 may be made of a photoresist or of any other etching resist.

Subsequently, the first polymer layer 21 is structured (FIG. 3). Structuring may be accomplished by photolithographic techniques known in the art. During structuring, through-holes 21.1, 21.2, 21.3 are generated in the first polymer layer 21. At the bottom of through-holes 21.1 and 21.3, the chip pads 3, 4 (e.g., made of aluminum) are exposed. The bottom of through-hole 21.2 is formed by the upper surface of the insulating layer 7.

Next, the metal layer 23 is applied onto the first polymer layer 21 and structured. In through-holes 21.1 and 21.3, the metal layer 23 makes contact to the chip pads 3 and 4, respectively. In through-hole 21.2, the second electrode 8 is formed onto the insulating layer 7.

Many techniques are available to generate the structured metal layer 23, inter alia galvanic deposition, electroless deposition, printing etc. By way of example, one of the available techniques will be explained in more detail in conjunction with FIGS. 7 to 9.

Then, the second polymer layer 22 is deposited over the metal layer 23 (FIG. 5). The second polymer layer 22 may be made of the same material as the first polymer layer 21 and the thickness of the second polymer layer 22 may be in the same range as the thickness of the first polymer layer 21.

The second polymer layer 22 is then structured by e.g., photolithographic techniques to provide for the openings 22.1, 22.2. The external contact elements 25.1, 25.2 are applied (e.g., solder ball attach). Thus, the first external contact element 25.1 is connected via a portion of the metal layer 23 to the first chip pad 3 and the second external contact element 25.2 is connected via a portion of the metal layer 23 to the second electrode 8 of the capacitor 6 and to the second chip pad 4.

It is to be noted that the method illustrated in FIGS. 3 to 5 (except the ball attach) are thin-film processes using techniques such as CVD, spin coating, galvanic plating, electroless plating, printing, photolithography etc., which are typical thin-film processes. These measures are part of the backend fabrication process, i.e. are fabrication processes which are applied after the integrated circuit has been finished and tested (so-called frontend processing). It is to be noted that the backend processes illustrated in FIGS. 3 to 5 may still be performed on wafer level, i.e. before the separation of the wafer into single chips.

Although some technologies (as e.g., lithographic processes) used during frontend processing and backend processing are of similar type, frontend processes and backend processes are often subject to largely different requirements. For instance, the positional accuracy required during frontend lithographic structuring needs to be much higher than the positional accuracy typically obtained during backend structuring. Therefore, different equipment may be used, resulting in that backend lithographic structuring is by far less expensive than frontend lithographic structuring. For instance, during backend lithographic structuring, the entire wafer may be exposed at the same time by using the same mask. As the area of exposure is as large as the entire usable area of the wafer, mask alignment tolerances may result in positional tolerances of about 4 µm. On the other hand, during frontend lithographic structuring, such large positional tolerances are unacceptable and therefore, stepper devices have to be used to sequentially expose partial areas of the wafer. As the first electrode 5 is structured during frontend processing and the second electrode 8 is structured during backend processing, the high positional accuracy of frontend processing is combined with the cost efficiency of backend processing.

Figure 6:
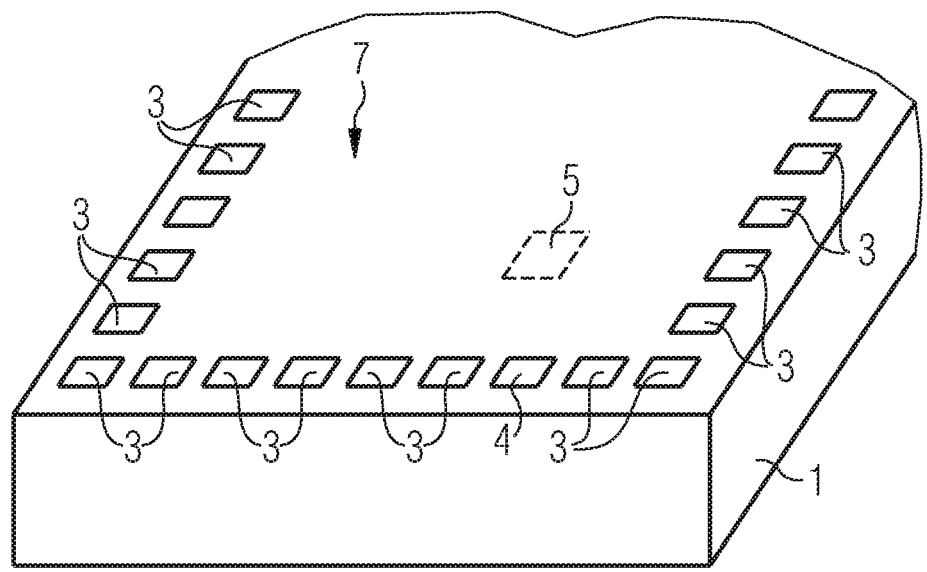
FIG. 6 illustrates a perspective view of a semiconductor chip including chip pads and a lower electrode of a capacitor.

FIGS. 6 to 9 illustrate the fabrication processes of a semiconductor device 400 illustrated in FIG. 8. Similar parts as illustrated in FIGS. 1 to 5 are denoted by the same reference signs throughout the figures. The description in conjunction to FIGS. 1 to 5 largely applies to the semiconductor device 400 and will therefore be omitted to avoid redundancy. FIG. 6 illustrates the semiconductor chip 1 at the end of the frontend processing. The insulating layer 7 is already applied to the first main surface 2 of the semiconductor chip 1 and structured to expose chip pads 3, 4. Chip pads 3, 4 extend along a peripheral region of the semiconductor chip 1. The first electrode 5 is illustrated by a phantom line because it is covered by the insulating layer 7. As already mentioned, the insulating layer 7 may be a hard passivation layer and covers substantially the entire first main surface 2 of the semiconductor chip 1 (except chip pads 3, 4. As already mentioned, the chip pads 3, 4 and the first electrode 5 may be made of the "final metal" of the semiconductor chip 1.

Figure 7:
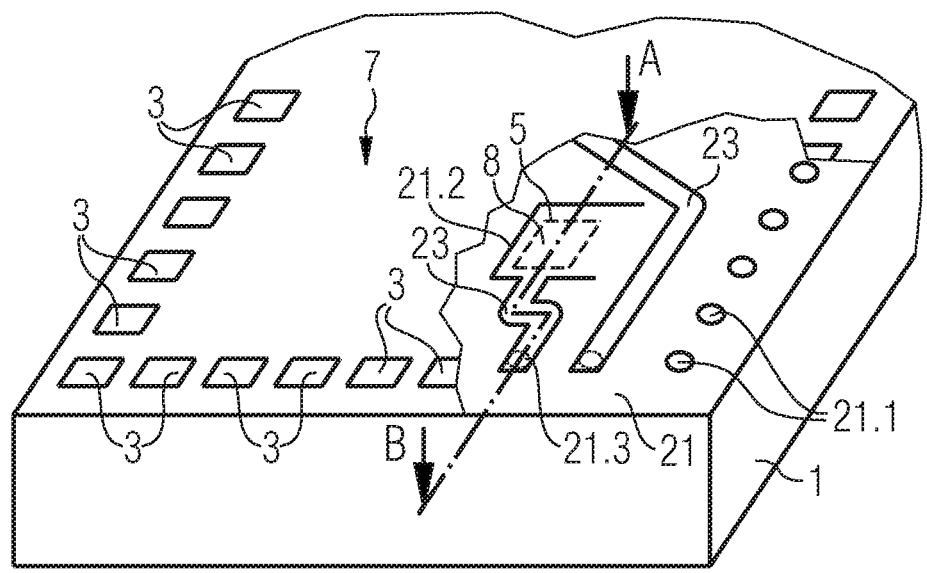
FIG. 7 illustrates a perspective view of a semiconductor device according to a second exemplary embodiment including the semiconductor chip illustrated in FIG. 6.

Then, the first polymer layer 21 is applied e.g., by spin coating and structured as illustrated in FIGS. 4 and 7 e.g., by lithographic techniques as explained above. That way, openings 21.1 and 21.3 for the connections to the metal layer 23 (redistribution layer) and opening 21.2 for the first electrode 8 are generated.

Then, the metal layer 23 together with the second electrode 8 are deposited by e.g., sputtering, structuring of a plating resist and electroplating. FIG. 8 illustrates a sectional view along line A-B in FIG. 7. Further, internal metal layer below the final metal layer of which chip pads 3, 4 and the first electrode 5 are made are illustrated.

An example of the capacitor 6 within detail X is illustrated in FIG. 9. The second electrode 8 includes an adhesive layer 8.1, a seed layer 8.2 and an electro-plated metal layer 8.3. The adhesive layer may be of sputtered TiW and may have a typical thickness of 50 nm. The seed layer 8.2 may be made of sputtered copper and may have a typical thickness of about 150 nm. The electro-plated metal layer 8.3 may also be made of copper and may have a desired thickness, e.g., about 2 to 7 μm or more. First, the adhesive layer 8.1 is deposited to cover all over the semiconductor chip 1. Then, the seed layer 8.2 is deposited and also covers the entire surface of the semiconductor chip 1. Then, a photoresist (not illustrated) is structured to cover such parts of the seed layer 8.2 where no metal of metal layer 8, 23 shall be applied. In other words, parts over the semiconductor chip 1, where conductive lines and the second electrode 8 are to be applied, are left uncovered. Then, the seed-layer 8.2 covering the entire wafer is used as a cathode in a galvanic deposition process. That way, electro-plated copper 8.3 is applied onto the uncovered parts of the continuous seed layer 8.2. Later on, the photoresist is stripped. This results in that the entire wafer surface is now covered by metal, namely the sputtered metal (e.g., copper) of the seed layer 8.2 and, where applied, the electro-plated metal (e.g., copper) of the electro-plated metal 8.3. In other words, the conductive lines and the second electrodes 8 to be fabricated in the redistribution layer are projecting parts of a wafer metal topography.

Then, the seed layer 8.2 and the adhesive layer 8.1 are removed by an etching process. This etching process may usually remove also an upper part of the electro-plated metal 8.3. At the end of the etching process, the structured metal layer 23 (i.e. the structured redistribution layer) is obtained.

It is to be noted that alternate techniques are available to produce the structured metal layer 23. For instance, the structured metal layer 23 may be generated by an electroless plating process or by a printing process etc.

As already mentioned in conjunction with FIG. 5, the structured metal layer 23 is then covered by a second polymer layer 22. It is to be noted that the conductive redistribution structure 20 may include more than one structured metal layer 23 and more than two polymer layers 21, 22.

Figure 10:
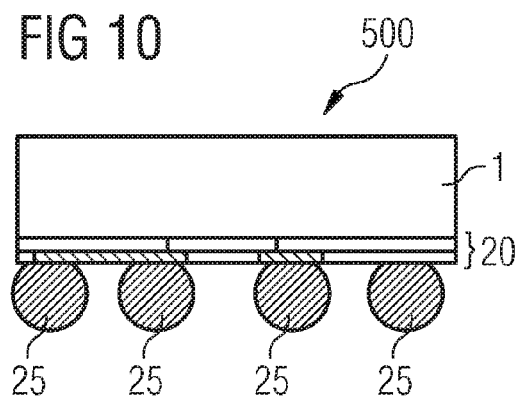
FIG. 10 illustrates a schematic cross-sectional view of a first module incorporating a semiconductor device according to an embodiment.

Semiconductor chips 1 are then separated by dividing the wafer into single chips 1. FIG. 10 illustrates a module 500 including a chip 1, a conductive redistribution structure 2 and external contact elements (e.g., solder balls) 25. This module 500 includes one or more capacitors 6 in accordance with the above description.

Figure 11:
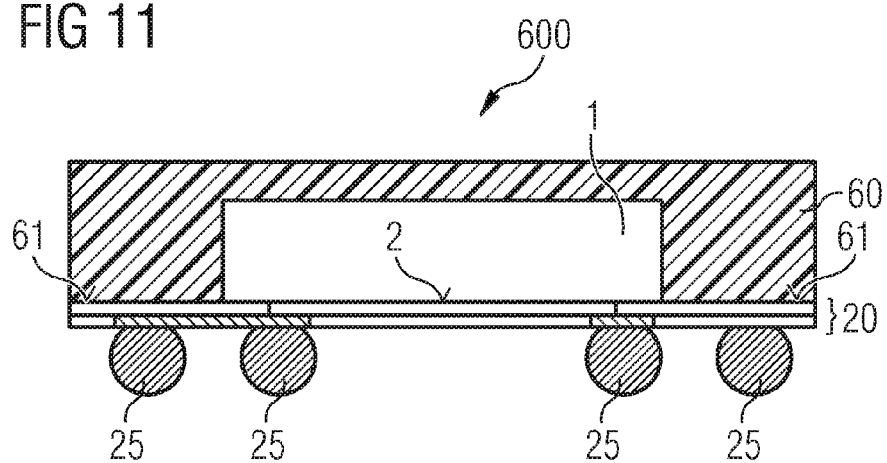
FIG. 11 illustrates a schematic cross-sectional view of a second module incorporating a semiconductor device according to an embodiment.

FIG. 11 illustrates another module 600. Module 600 is similar to module 500 except that the semiconductor chip 1 is embedded in a mold material 60. The mold material 60 may be any appropriate thermoplastic or thermosetting material. The mold material has a main surface 61 which is flush with the first main surface 2 of the semiconductor chip 1. The conductive redistribution structure 20 extends in a lateral direction beyond the outline of the semiconductor chip 1 on the main surface 61. Thus, the mold material 60 allows to enlarge the footprint of the module 600 such that external contact elements 25 may be located outside the outline of the semiconductor chip 1. Such modules are referred to as "fan-out" structures in the art.

Figure 12:
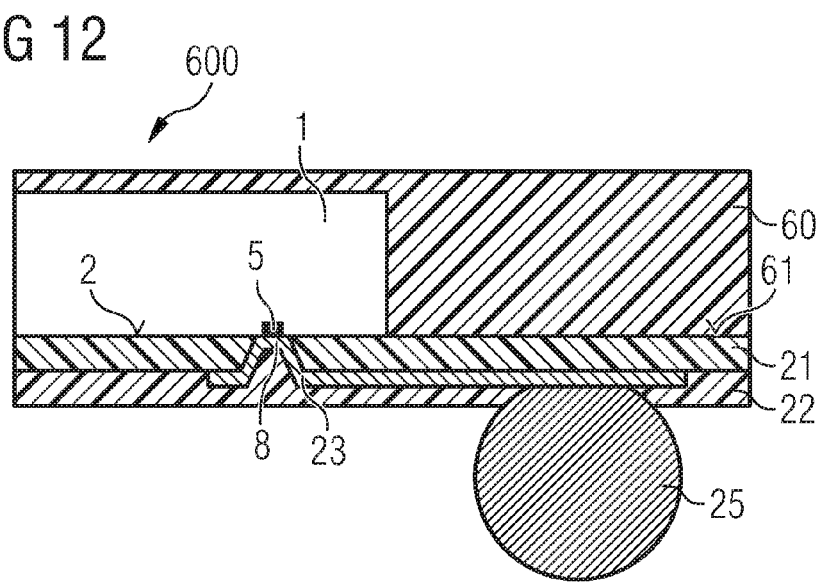
FIG. 12 illustrates a schematic cross-sectional view of a detail Y illustrated in FIG. 11.

FIG. 12 is an enlarged view of the fan-out region of module 600. The second electrode 8 of the capacitor 6 may be directly connected to an external contact element 25 arranged over the mold material 60 by the metal layer 23.

Figure 17:
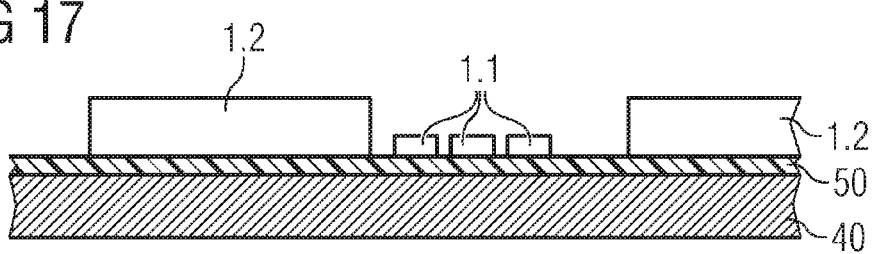
FIGS. 17-20 illustrate schematic cross-sectional views showing fabrication processes to manufacture a third module incorporating a semiconductor device as illustrated in FIG. 13.
Figure 18:
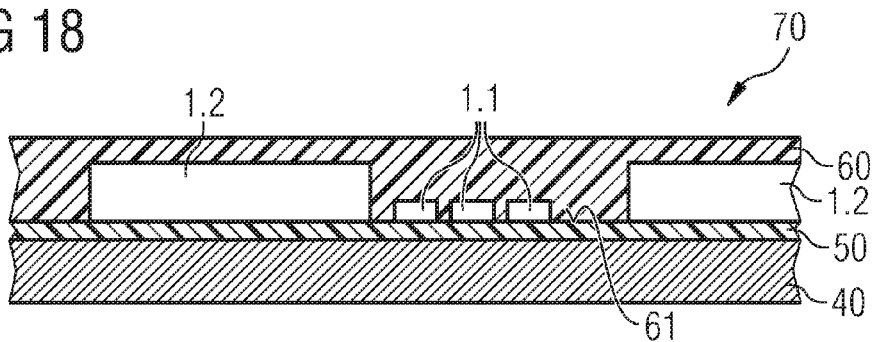

Various techniques may be employed to cover the semiconductor chip 1 with the mold material 60. One of these techniques is described later in conjunction with FIGS. 17 and 18 in greater detail. Briefly, by way of example, after frontend processing, the wafer including the finished semiconductor chips 1 may be divided into the single semiconductor chips 1. Then, the semiconductor chips 1 may be placed on a carrier in a spaced-apart relationship. The mold material 60 is then applied in liquid form and a reconstituted or artificial wafer is formed by e.g., compression molding or injection molding. This reconstituted wafer is then subjected to backend fabrication processes by which the conductive redistribution structure 20 is generated in accordance with the above description. These backend fabrication processes are applied to the common plane which is formed by the first main surfaces 2 of the semiconductor chips 1 and the surface 61 of the mold material 60 embedding the semiconductor chips 1. At the end of backend fabrication, the reconstituted wafer is divided in a plurality of modules 600.

Figure 13:
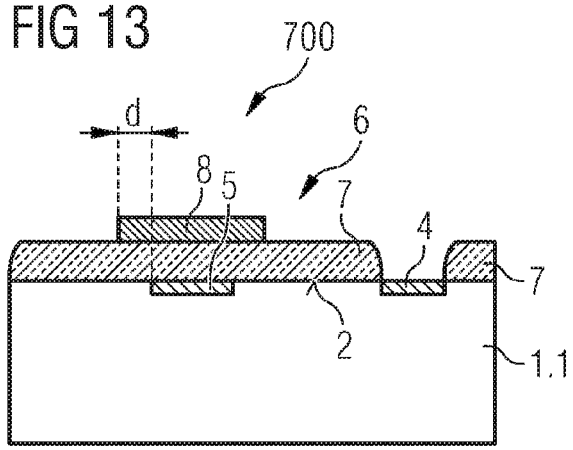
FIG. 13 illustrates a schematic cross-sectional view of a semiconductor device according to a further exemplary embodiment.

FIG. 13 illustrates a semiconductor device 700 according to a further exemplary embodiment. The semiconductor device 700 is similar to the semiconductor device 100 of FIG. 1 with the exception that the semiconductor chip 1.1 is not an active element, i.e. fails to include an integrated circuit having transistors etc. By way of example, the semiconductor chip 1.1 may only include the "final" metal layer of which the first electrode 5, the chip pad 4 and a metal line (not visible in the sectional view of FIG. 13) interconnecting the first electrode 5 and the chip pad 4 are made. Thus, the semiconductor chip 1.1 of device 700 may be represented by a piece of bulk silicon which is equipped with a "hybrid" capacitor 6 as explained above. It is to be noted that the semiconductor device 700 may also be equipped with an insulating layer 7 which is thinner in a region between the first and second electrode as illustrated in FIG. 2.

Figure 14:
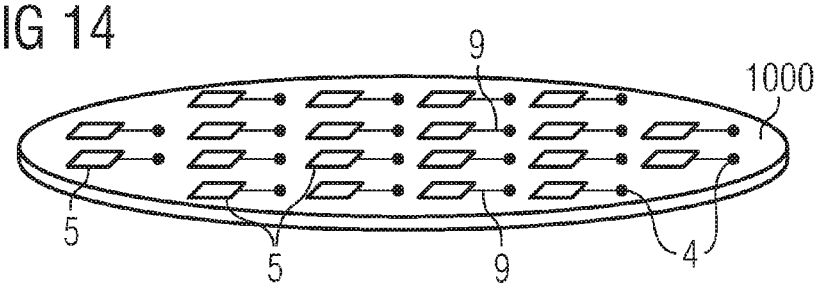
FIGS. 14-16 illustrate schematic illustrations of fabrication processes for manufacturing the semiconductor device of FIG. 13.
Figure 15:
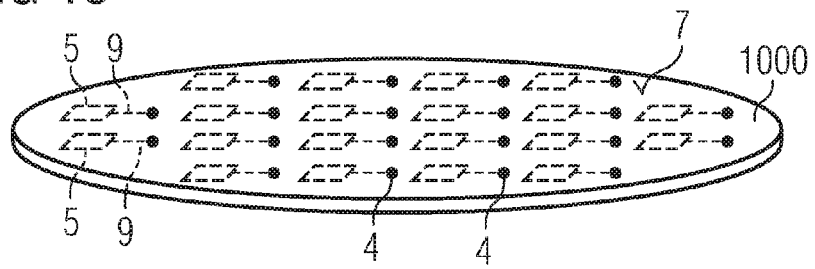
Figure 16:
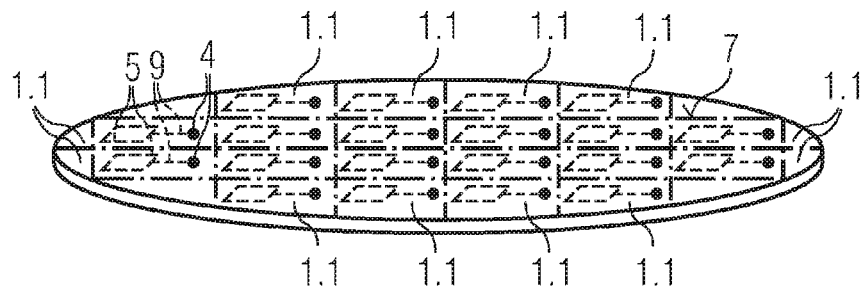

FIGS. 14 to 16 illustrate fabrication processes to manufacture the device 700 illustrated in FIG. 13 except second electrode 8, which is applied later.

During frontend processing, the "final metal" (which may here optionally be the sole metal) is applied as a metal layer on a wafer 1000. This metal layer is structured to generate the first electrode 5, the chip pad 4 and the metal line 9 interconnecting the first electrode 5 and the chip pad 4. Thus, first electrode 5, chip pad 4 and metal line 9 may be generated in a fully parallel process at wafer level.

Then, as illustrated in FIG. 15, the insulating layer 7 such as e.g., an inorganic hard passivation is applied in the desired thickness as explained above. The insulating layer 7 is opened at the chip pad 4 positions.

As illustrated in FIG. 16, the wafer 1000 is then diced into single semiconductor chips 1.1. These semiconductor chips 1.1 may contain a single first electrode 5 or multiple first electrodes 5. In the latter case, also multiple metal lines 9 (one for each first electrode 5) each interconnecting to one of multiple chip pads 4 are provided.

FIGS. 17 to 20 illustrate manufacturing processes for fabricating a semiconductor module 800 (FIG. 20) embodying the semiconductor device 700. The semiconductor chips 1.1 (with applied insulating layer 7) may be placed on a carrier 40. Further, other semiconductor chips 1.2 being equipped with an integrated circuit (i.e. having active integrated functional elements such as transistors, diodes etc,) are placed on the carrier 40 in a spaced-apart relationship next to the semiconductor chips 1.1 (which are passive elements). An adhesive tape 50 may cover the carrier 40 and hold the semiconductor chips 1.1 and 1.2 in place. The active semiconductor chips 1.2 may be of any type, i.e. they may be of the type described above in conjunction with FIGS. 1 to 12 and denoted by reference sign 1 (i.e. may embody a first electrode 5 to form a capacitor 6), or they may be of conventional type without a first electrode 5 of a capacitor 6.

The mold material 60 is then applied in liquid form and a reconstituted or artificial wafer 70 is formed by e.g., compression molding or injection molding. In the reconstituted wafer 70, one or several semiconductor chips 1.1 are arranged around or along one or more sides close to each semiconductor chip 1.2. The semiconductor chips 1.1 may be considerably smaller in their lateral dimensions and/or in their thickness than the semiconductor chips 1.2 incorporating active functional elements.

Figure 19:
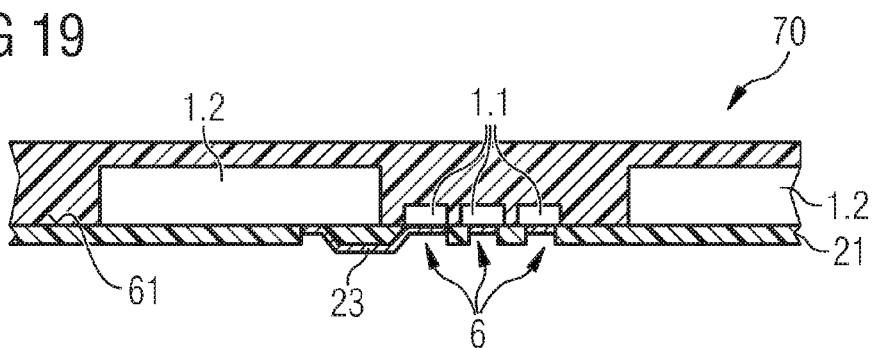
Figure 20:
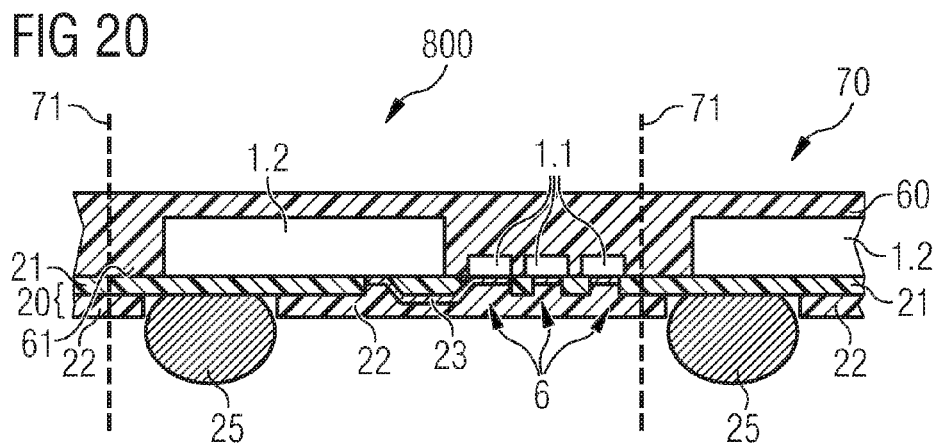

After curing of the mold material 60, the reconstituted wafer 70 is removed from the carrier 40 and the adhesive tape 50 is stripped (FIG. 19). The reconstituted wafer 70 is then subjected to backend fabrication processes by which the conductive redistribution structure 20 is generated in accordance with the foregoing description. As may be seen from FIG. 19, these backend fabrication processes are applied to a common plane which is formed by the main surfaces of the semiconductor chips 1.1 and 1.2 and a surface 61 of the mold material 60 embedding the semiconductor chips 1.1 and 1.2. The foregoing description of the thin film technology used during backend wafer (or reconstituted wafer) processing also applies to FIGS. 19 and 20. Thus, the conductive redistribution structure 20 may be established by applying two polymer layers 21, 22 and the structured metal layer 23 which includes the second electrode 8 of the capacitor 6. Thus, the structured metal layer 23 connects a first chip pad (not illustrated) of the active semiconductor chip 1.2 to a chip pad 4 (FIG. 13) of the passive semiconductor chip 1.1 and further connects a second chip pad (not illustrated) of the active semiconductor chip 1.2 to the second electrode 8 (FIG. 13) arranged above the passive semiconductor chip 1.1 and e.g., being formed integral with the structured metal layer 23. That way, the integrated circuit of the active semiconductor chip 1.2 is interconnected to the capacitor 6 at the passive semiconductor chip 1.1.

After or before the application of external contact elements 25, the reconfigured wafer 70 is divided into single semiconductor modules 800 at separation lines 71. In the semiconductor module illustrated in FIG. 20, no or less of the expensive semiconductor area of the active semiconductor chip 1.2 has to be used for the first electrode 5, i.e. for implementing capacitors 6. Further, the electrical performance of the module 800 may improve by relocating the capacitors 6 in "satellite" semiconductor chips 1.1. That way, the fan-out area of the semiconductor module 800, which in conventional modules may only serve to enlarge the footprint of the module in order to provide a sufficiently large area for the external contact elements 25, is exploited for additional benefit.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor chip having an uppermost internal metal layer, the uppermost internal metal layer including chip pads and a first electrode of a capacitor;
   an insulating layer on top of the first electrode; wherein the insulating layer is a passivation layer covering a main surface of the semiconductor chip, a portion of the passivation layer being thinned on top of the first electrode relative to the remaining portions of the passivation layer; and
   a second electrode of the capacitor disposed in a redistribution structure above the semiconductor chip so that only the thinned portion of the insulating layer is disposed between the second electrode and the first electrode, wherein the area of the second electrode is larger than the area of the first electrode such that a length of the second electrode extends beyond a length of the first electrode in at least one lateral dimension.

2. The semiconductor device according to claim 1, wherein the insulating layer is made of an inorganic material.

3. The semiconductor device according to claim 2, wherein the insulating layer on top of the first electrode has a thickness of less than 300 nm, in particular less than 200 nm.

4. The semiconductor device according to claim 2, wherein the insulating layer on top of the first electrode has a thickness of less than 50 nm, in particular less than 30 nm.

5. The semiconductor device according to claim 2, wherein the insulating layer is made of one or a mixture of materials of a group comprising silicon oxide, silicon nitride, low-k dielectric material and ferroelectric material.

6. The semiconductor device according to claim 1, further comprising:
   an integrated circuit provided in the semiconductor chip;
   a polymer layer arranged over the insulating layer; and
   a conductive line connecting the second electrode with the integrated circuit, wherein the conductive line is applied over the polymer layer.

7. The semiconductor device according to claim 1, wherein the semiconductor chip further comprises at least one chip pad which is made of the same metal layer as the first electrode of the capacitor.

8. The semiconductor device according to claim 7, wherein the semiconductor chip further comprises a metal line connecting the first electrode to the at least one chip pad.

9. The semiconductor device of claim 1, wherein the uppermost metal layer comprises a final metal of the semiconductor chip.

10. The semiconductor device of claim 1, wherein the uppermost metal layer comprises an uppermost metal layer internal to the semiconductor chip.

11. The semiconductor device of claim 1, wherein the uppermost metal layer comprises a metal layer employed for internal wiring of the semiconductor chip.

12. The semiconductor device of claim 1, wherein the second electrode is formed from a redistribution layer.

13. The semiconductor device of claim 12, wherein the redistribution layer extends in a lateral dimension beyond an outline of the semiconductor chip.

14. A semiconductor device, comprising:
- a semiconductor chip having a first electrode of a capacitor disposed in an uppermost internal metal layer;
- a passivation layer disposed over a main surface of the semiconductor chip, wherein a portion of the passivation layer is thinner on top of the first electrode of the capacitor than other portions of the main surface;
- a second electrode of the capacitor disposed in a redistribution structure above the semiconductor chip so that only the thinned portion of the passivation layer is disposed between the second electrode and the first electrode;
- contact pads representing external terminals of the semiconductor device; and
- conductive lines disposed in the redistribution structure connecting the contact pads of the semiconductor device to chip pads of the semiconductor chip, wherein the second electrode is made of the same metal layer as the conductive lines, and wherein the chip pads are disposed in the uppermost metal layer internal to the semiconductor chip, wherein the area of the second electrode is larger than the area of the first electrode such that a length of the second electrode extends beyond a length of the first electrode in at least one lateral dimension.

15. The semiconductor device according to claim 1, further comprising:
- a molding material accommodating the semiconductor chip.

16. The semiconductor device of claim 14, wherein the uppermost metal layer comprises a metal layer employed for internal wiring of the semiconductor chip.

17. The semiconductor device of claim 14, wherein the second electrode is formed from a redistribution layer.

18. The semiconductor device of claim 17, wherein the redistribution layer extends in a lateral dimension beyond an outline of the semiconductor chip.

\* \* \* \* \*